(12) United States Patent
White

(10) Patent No.: US 10,778,155 B2
(45) Date of Patent: Sep. 15, 2020

(54) DYNAMIC DIFFERENTIAL AMPLIFIER WITH ENHANCED GAIN

(71) Applicant: BAE Systems Information and Electronic Systems Integration Inc., Nashua, NH (US)

(72) Inventor: Randall M. White, Merrimack, NH (US)

(73) Assignee: BAE Systems Information and Electronic Systems Integration Inc., Nashua, NH (US)

(*) Notice: Subject to any disclaimer, the term of this patent is extended or adjusted under 35 U.S.C. 154(b) by 22 days.

(21) Appl. No.: 16/211,049

(22) Filed: Dec. 5, 2018

(65) Prior Publication Data

US 2020/0186102 A1 Jun. 11, 2020

(51) Int. Cl.
*H03F 3/45* (2006.01)
*H03F 1/32* (2006.01)
*H03F 1/02* (2006.01)

(52) U.S. Cl.
CPC ......... *H03F 1/3211* (2013.01); *H03F 1/0227* (2013.01); *H03F 3/45632* (2013.01)

(58) Field of Classification Search
CPC .......... H03F 3/005; H03F 3/45; H03M 1/124; H03M 1/129

USPC .............................................. 330/9; 341/172
See application file for complete search history.

(56) References Cited

U.S. PATENT DOCUMENTS

2009/0096647 A1* 4/2009 Nazemi ................. H03M 1/44
341/122

* cited by examiner

*Primary Examiner* — Steven J Mottola
(74) *Attorney, Agent, or Firm* — Finch & Maloney PLLC

(57) ABSTRACT

A dynamic differential amplifier includes: gain transistors to drive with differential input voltage levels; sample capacitors having first terminals to ramp from an initial voltage level to differential amplified voltage levels of the input voltage levels in response to the driven gain transistors; and adjustment circuits to adjust the amplified voltage levels in the direction of the initial voltage level by an offset voltage level. In some cases, second terminals of the sample capacitors are a common-mode node to maintain a common-mode voltage level midway between the ramping voltage levels of the first terminals. In some cases, the dynamic differential amplifier further includes a comparison circuit to compare the maintained common-mode voltage level to a threshold voltage level, wherein the first terminals of the sample capacitors stop ramping and the adjustment circuits adjust the amplified voltage levels in response to the compared common-mode voltage level reaching the threshold voltage level.

18 Claims, 6 Drawing Sheets

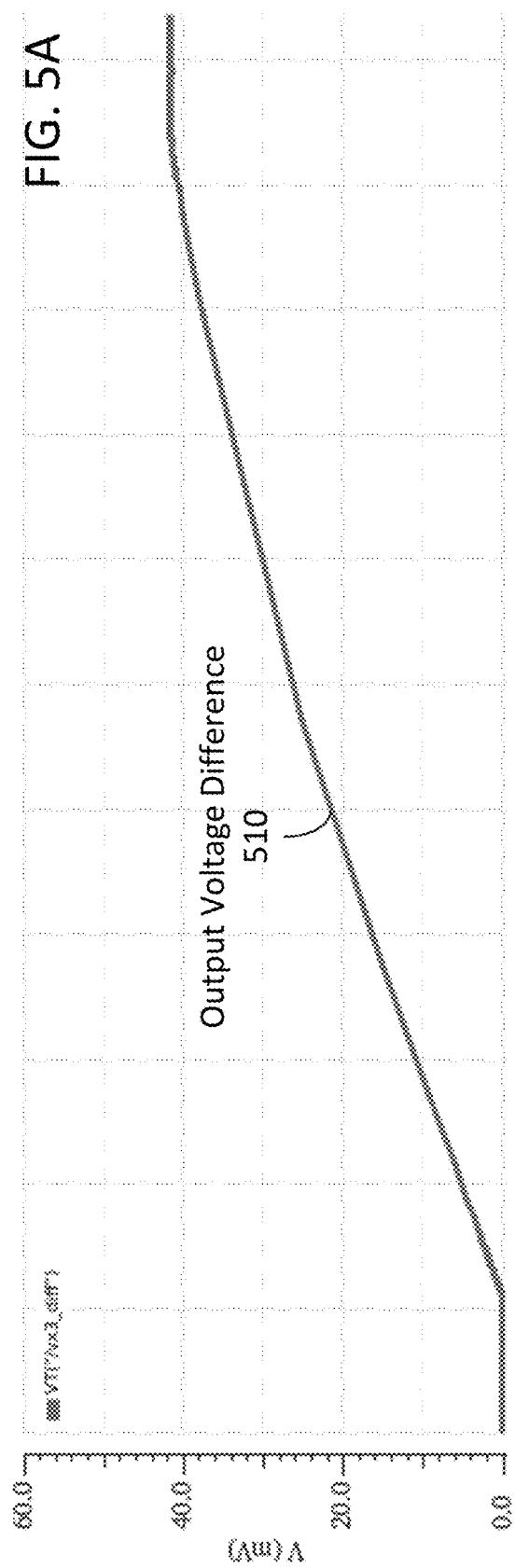
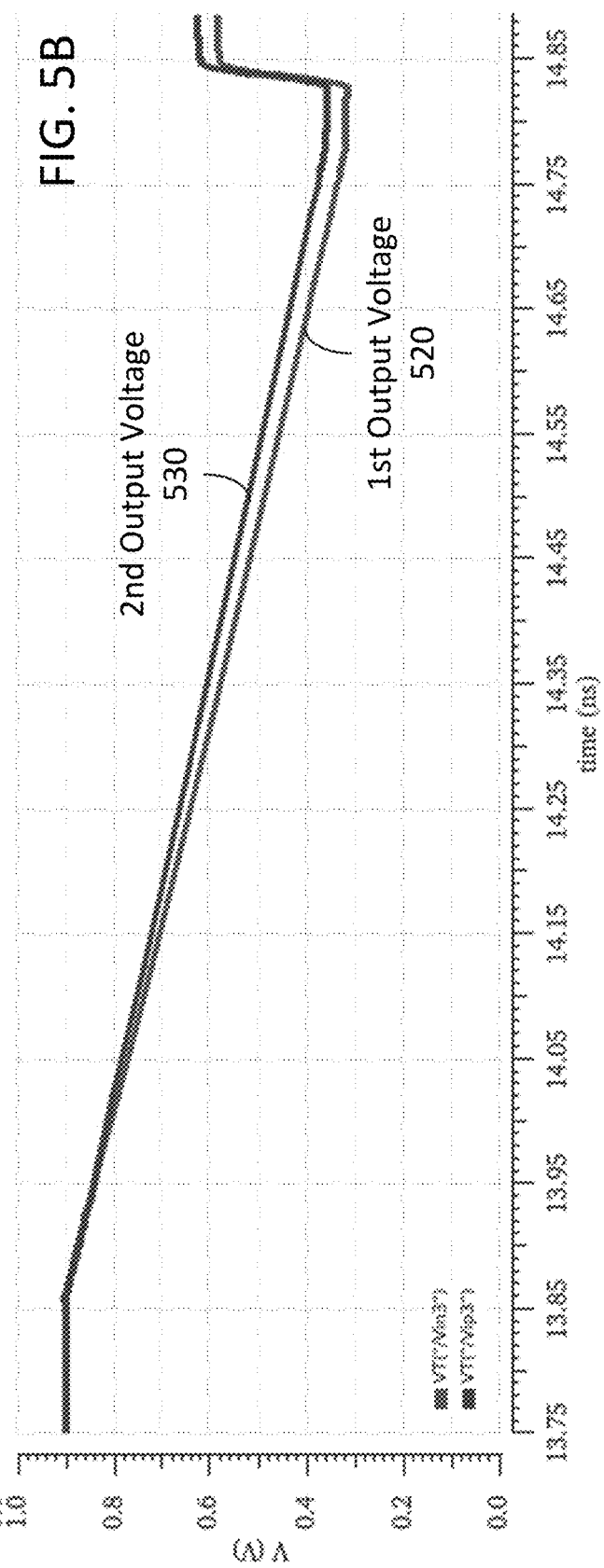
FIG. 5A
FIG. 5B

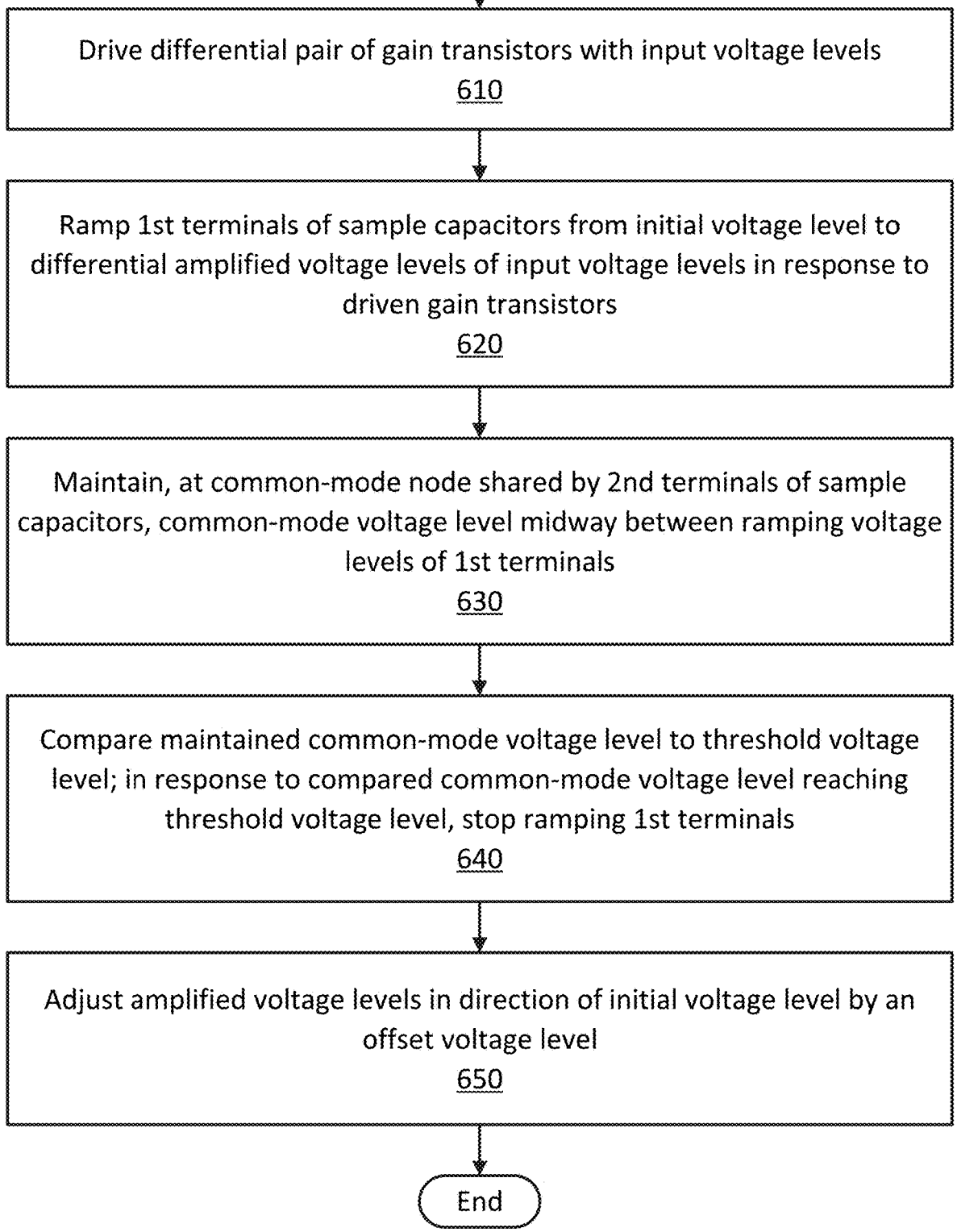

DYNAMIC DIFFERENTIAL AMPLIFIER WITH ENHANCED GAIN

FIELD OF THE DISCLOSURE

This disclosure relates to a dynamic differential amplifier with enhanced gain, such as for use with an analog-to-digital converter (ADC).

BACKGROUND

ADCs convert analog signals to digital equivalents or approximations of the signals. ADCs and other circuits can use amplifier circuits in their implementations. Many applications, such as electronic circuits, are configured to maintain and transmit an analog signal as a differential pair of signals, where the value of the analog signal is equal to the voltage difference of the pair of signals. However, there are a number of nontrivial issues associated with improving or optimizing the performance of amplifiers that use differential signaling.

BRIEF DESCRIPTION OF THE DRAWINGS

FIGS. 5A-5B are timing diagrams of voltage gain in an example dynamic differential amplifier, such as the dynamic differential amplifier of FIG. 4, according to an embodiment of the present disclosure.

FIG. 6 is a flow diagram of an example method of differential amplifying, such as with the dynamic differential amplifiers of FIGS. 3-4, according to an embodiment of the present disclosure.

Figure 1:
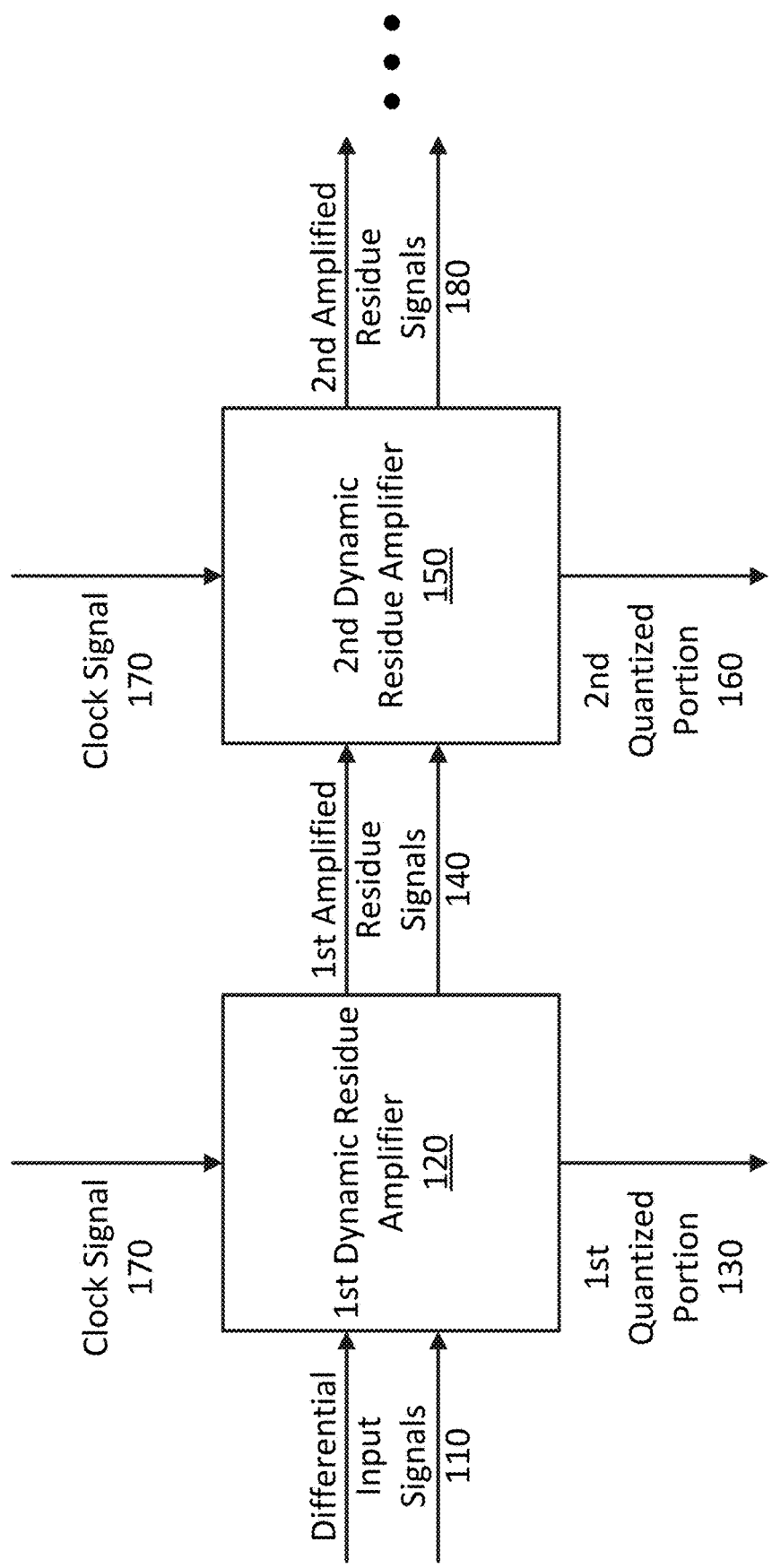
FIG. 1 is a block diagram of an example pipelined analog-to-digital converter (ADC), according to an embodiment of the present disclosure.

Although the following Detailed Description will proceed with reference being made to illustrative embodiments, many alternatives, modifications, and variations thereof will be apparent to those in light of the present disclosure.

DETAILED DESCRIPTION

A dynamic differential amplifier is provided. In an embodiment, the amplifier is dynamic in that there is a lack of static power dissipation in the amplifier, and the amplifier employs differential signals for both input and output signals. The dynamic differential amplifier includes a differential pair of gain transistors with corresponding sample capacitors and adjustment circuits (such as level shifters). The gain transistors are driven with differential input voltage levels centered about a target voltage level (such as a voltage level well within the linear region of the gain transistor performance). In some such example embodiments, the gain transistors are n-type field-effect transistors (FETs), but in other embodiments can be other types of transistors (such as p-type FETs, which exhibit complementary behavior), as will be apparent in light of this disclosure. The first terminals of the sample capacitors are initialized to a first voltage level (such as high voltage). The voltage levels of the first terminals decrease as corresponding charges are drained in response to (e.g., proportional to) the driven gain transistors. This is also referred to as ramping the first terminals of the capacitors.

In more detail, the voltage levels of the first terminals ramp (e.g., decrease linearly) in proportion to the corresponding input voltage levels applied to the gain transistors. As the ramping takes place, the difference between the voltage levels of the first terminals increases in proportion to the difference of the input voltage levels. As such, the first terminals have differential amplified voltage levels of the input voltage levels. The longer the ramping, the greater the amplification or gain, subject to the (usually small) voltage range within which the circuit can operate. Accordingly, the ramping should stop before one or both voltage levels of the first terminals gets too small. After the ramping, the adjustment circuits (e.g., level shifters) adjust the amplified voltage levels of the first terminals of the sample capacitors upward (e.g., in the direction of the initial voltage level) by an offset voltage level. The adjustment maintains the same voltage difference between the first terminals, but brings the average (or common-mode voltage) of the first terminals to a more useful level, such as a target voltage level useful for driving follow-on differential circuits.

In some embodiments, the second terminals of the sample capacitors share a common-mode node that maintains the common-mode voltage level midway between the ramping voltage levels of the first terminals. In some such embodiments, a comparison circuit compares the maintained common-mode voltage level to a threshold voltage level. Once the common-mode voltage level reaches the threshold voltage level, the first terminals of the sample capacitors stop ramping and the adjustment circuits adjust the amplified voltage levels. By choosing, for example, a suitably low threshold voltage level, this allows the dynamic differential amplifier to exploit most of the available voltage range for ramping while still outputting differential signals centered about a target voltage level for follow-on circuits. In some embodiments, the dynamic differential amplifier includes a reset circuit to reset the first terminals of the sample capacitors to the initial voltage level (e.g., high voltage). In some embodiments, the dynamic differential amplifier includes a hold circuit to hold the adjusted amplified voltage levels for use by a subsequent circuit in response to a clock signal. Numerous other embodiments and variations will be apparent in light of the present disclosure.

General Overview

As mentioned above, there are a number of nontrivial issues associated with improving or optimizing the performance of amplifiers that use differential signaling. For example, newer (and faster) technologies can reduce the processing time and voltage range available to their corresponding circuits, which can limit the time and working voltage available to amplifier circuits. For instance, modern process nodes can function in a voltage range of 0 to 0.9 volts (V). This can limit the gain of fully dynamic open-loop amplifiers.

Accordingly, and in accordance with an embodiment of the present disclosure, dynamic differential amplifiers having enhanced gain are provided. In some embodiments, fully dynamic differential amplifiers (e.g., having differential input and output signals) are used in pipelined ADCs to provide low-noise amplification of residue voltages with reduced power dissipation. For instance, the ADCs can be organized sequentially in stages, each stage working on a different portion of the differential input signals, and the processing performed over several clock cycles, one stage per cycle. Multiple inputs can be processed concurrently in a pipeline fashion, each input starting on a different clock cycle and being processed by a different stage than the other inputs. In one or more embodiments, the differential output signals from one stage are at the appropriate common-mode voltage for use as differential input signals of the next stage.

In addition, in one or more embodiments, the available voltage range is increased or maximized to increase or maximize the available gain in the dynamic differential amplifiers. This increase or maximizes the amount of precision or quantization obtained per stage, which reduces or minimizes the number of stages (and processing time) for the ADC. Corresponding dynamic residue amplifiers, ADCs, and methods of dynamic differential amplifying, dynamic residue amplifying, and analog-to-digital conversion are also provided. Still further embodiments will be apparent in light of the present disclosure.

In one or more embodiments, the dynamic differential amplifier provides amplification by discharging sample capacitors through a switched differential pair. The output common-mode voltage is sensed by a common node of the second terminals of the sample capacitors and discharged at a rate determined by ID/CL, where ID is the drain current through the differential pair and CL is the total effective output capacitance. The amplification phase is terminated when the common-mode voltage falls below a threshold voltage level, such as the voltage threshold of an inverter circuit. As such, the amplification phase has a duration $TA=(VDD-VT)\div(ID/CL)$, where VDD is the high voltage and VT is the threshold voltage of the inverter. The gain of the circuit is $A=(GM/ID)\times(ID/CL)\times TA=(GM/ID)\times(VDD-VT)$, where GM is the transconductance. As such, the gain A can be maximized by biasing the input devices at the highest transconductor efficiency (GM/ID) possible and by letting the amplifier discharge the output capacitors over as large of a voltage range as possible.

However, it is also desirable to maintain a common-mode voltage at the output near mid-rail (or even higher) if, for example, the subsequent signal processing stage uses n-type FET (nFET) input devices. In some embodiments, the dynamic differential amplifier uses a capacitive level-shift to allow the gain of a corresponding dynamic residue amplifier to be maximized while providing a well-controlled common-mode output voltage for follow-on circuits. In some embodiments, input switches are bootstrapped to allow the dynamic residue amplifier to incorporate a track and hold function. In some embodiments, a hold circuit (such as a sample and hold circuit or a track and hold circuit) is used in conjunction with a clock signal to store differential amplified output signals from the dynamic differential amplifier for use by the next stage of a pipelined ADC. In some embodiments, a division capacitor also shares the common-mode node of the sample capacitors and allows the ramp voltage to be decoupled from the inverter threshold, which allows the ramp termination voltage to be set lower than mid-supply (or other desired common-mode voltage of the amplified output signals).

In one or more embodiments, the gain of the dynamic differential amplifier is proportional to the ramp voltage. In one or more embodiments, capacitive level-shift circuits are used to decouple the dynamic differential amplifier's ramp voltage from the common mode voltage of the subsequent processing stage. In one or more embodiments, the capacitive level-shift is implemented in a pipelined ADC by applying a positive-going voltage step to some fraction of the subsequent stage's sample capacitor. In one or more embodiments, the addition of a division capacitor to provide a voltage division of the ramp common-mode sense voltage allows the ramp termination voltage to be set lower than an inverter threshold (e.g., lower than mid-supply or other nearby desired common-mode voltage of the subsequent stage).

In one or more embodiments, a dynamic differential amplifier is provided. The dynamic differential amplifier includes gain transistors driven by differential input voltage levels, sample capacitors having first terminals that ramp from an initial voltage level to differential amplified voltage levels of the input voltage levels in response to the driven gain transistors, and adjustment circuits to adjust the amplified voltage levels in the direction of the initial voltage level by an offset voltage level. In some such embodiments, second terminals of the sample capacitors share a common-mode node that maintains a common-mode voltage level midway between the ramping voltage levels of the first terminals. In some such embodiments, the dynamic differential amplifier further includes a comparison circuit to compare the maintained common-mode voltage level to a threshold voltage level. Here, the first terminals of the sample capacitors stop ramping and the adjustment circuits adjust the amplified voltage levels in response to the compared common-mode voltage level reaching the threshold voltage level.

In some embodiments, the dynamic differential amplifier further includes a division capacitor one of whose terminals also shares the common-mode node. In one or more embodiments, the dynamic differential amplifier is part of a multi-stage circuit. Here, the adjusted amplified voltage levels are centered about a target voltage level for differential input signals of a subsequent stage of the multi-stage circuit. In one or more embodiments, the dynamic differential amplifier further includes a reset circuit that resets the first terminals of the sample capacitors to the initial voltage level. In one or more embodiments, the dynamic differential amplifier further includes a hold circuit that holds the adjusted amplified voltage levels for use by a subsequent circuit in response to a clock signal. In one or more embodiments, a dynamic residue amplifier includes the dynamic differential amplifier and a residue circuit to generate differential residue voltage levels from differential input signals with respect to a gain amount of the dynamic differential amplifier, to supply as the input voltage levels to the dynamic differential amplifier.

In one or more embodiments, an analog-to-digital converter (ADC) includes the dynamic residue amplifier. Here, the residue circuit is a first residue circuit and further generates a first quantized portion from the differential input signals with respect to the gain amount of the dynamic differential amplifier. In addition, the differential residue voltage levels are first differential residue voltage levels. Further, the ADC also includes a second residue circuit that generates a second quantized portion and second differential residue voltage levels from the adjusted amplified voltage levels with respect to the gain amount of the dynamic differential amplifier.

In one or more embodiments, a method of dynamic differential amplifying is provided. The method includes driving a differential pair of gain transistors with input voltage levels, ramping first terminals of sample capacitors from an initial voltage level to differential amplified voltage levels of the input voltage levels in response to the driven gain transistors, and adjusting the amplified voltage levels in the direction of the initial voltage level by an offset voltage level. In some such embodiments, the method further includes maintaining, at a common-mode node shared by second terminals of the sample capacitors, a common-mode voltage level midway between the ramping voltage levels of the first terminals. In some such embodiments, the method further includes comparing the maintained common-mode voltage level to a threshold voltage level. Here, ramping the first terminals stops and adjusting the amplified voltage levels starts in response to the compared common-mode voltage level reaching the threshold voltage level. In one or more embodiments, the method further includes resetting the first terminals of the sample capacitors to the initial voltage level.

In one or more embodiments, the method further includes holding the adjusted amplified voltage levels for use by a subsequent circuit in response to a clock signal. In one or more embodiments, a method of dynamic residue amplifying includes performing the dynamic differential amplifying and generating differential residue voltage levels from differential input signals with respect to a gain amount of the dynamic differential amplifying, to supply as the input voltage levels to the dynamic differential amplifying. In some such embodiments, the differential residue voltage levels are first differential residue voltage levels and the dynamic residue amplifying further includes generating a first quantized portion from the differential input signals with respect to the gain amount of the dynamic differential amplifying, and generating a second quantized portion and second differential residue voltage levels from the adjusted amplified voltage levels with respect to the gain amount of the dynamic differential amplifying. In one or more embodiments, a method of analog-to-digital converting includes performing the dynamic residue amplifying, and performing the dynamic differential amplifying a second time, this time supplying the second differential residue voltage levels as the input voltage levels to the second dynamic differential amplifying.

In one or more embodiments, an analog-to-digital converter (ADC) includes a plurality of dynamic residue amplifiers. At least one such dynamic residue amplifier includes a dynamic differential amplifier and a residue circuit as described above. In some such embodiments, the at least one dynamic residue amplifier further includes a hold circuit to hold the adjusted amplified voltage levels as the differential input signals of the residue circuit of a subsequent one of the dynamic residue amplifiers in response to a clock signal. In addition, the adjusted amplified voltage levels are centered about a target voltage level for the differential input signals of the residue circuit of the subsequent one of the dynamic residue amplifiers. In some embodiments, the differential input signals are the adjusted amplified voltage levels of the dynamic differential amplifier of a previous one of the dynamic residue amplifiers. Numerous other embodiments and configurations are possible in light of the present disclosure.

System Architecture

FIG. 1 is a block diagram of an example pipelined analog-to-digital converter (ADC) 100, according to an embodiment of the present disclosure. The ADC 100 and other components described throughout can be fabricated, for example, as an integrated circuit (IC) using IC fabrication techniques such as photolithography.

Referring to FIG. 1, the ADC 100 includes a plurality of ordered stages, each stage including a dynamic residue amplifier together with various input and output signals of the dynamic residue amplifier. In further detail, the ADC 100 includes a plurality of dynamic residue amplifiers, including a first dynamic residue amplifier 120, a second dynamic residue amplifier 150, and so on. The dynamic residue amplifiers use differential input and output signals. The first dynamic residue amplifier 120 receives differential input signals 110 and converts the differential input signals 110 into a first quantized portion 130 and first amplified residue signals 140 with respect to a gain amount of the first dynamic residue amplifier 120. The first amplified residue signals 140 are held by a hold circuit in response to a clock signal 170.

The held first amplified residue signals 140 are input to the second dynamic residue amplifier 150, which converts the first amplified residue signals 140 into a second quantized portion 160 and second amplified residue signals 180 with respect to a gain amount of the second dynamic residue amplifier 150. The second amplified residue signals 180 are held by a hold circuit in response to the clock signal 170. The operations of each of the first dynamic residue amplifier 120 and the second dynamic residue amplifier 150 can be performed on consecutive clock cycles in a pipelined fashion. While the results are being generated by the second dynamic residue amplifier 150, the first dynamic residue amplifier 120 can process a different set of differential input signals 110 since the values of the first amplified residue signals 140 generated in the previous clock cycle are held by the hold circuit until the clock signal 170 is asserted again (e.g., to prepare for the next clock cycle).

In a similar fashion, additional dynamic residue amplifiers (and corresponding signals to drive them or be driven by them) can be added to the pipelined ADC 100 similar to that of the first dynamic residue amplifier 120 and the second dynamic residue amplifier 150. In some embodiments, the final dynamic residue amplifier is replaced with a residue circuit or similar circuitry to only generate the final quantized portion.

Figure 2:
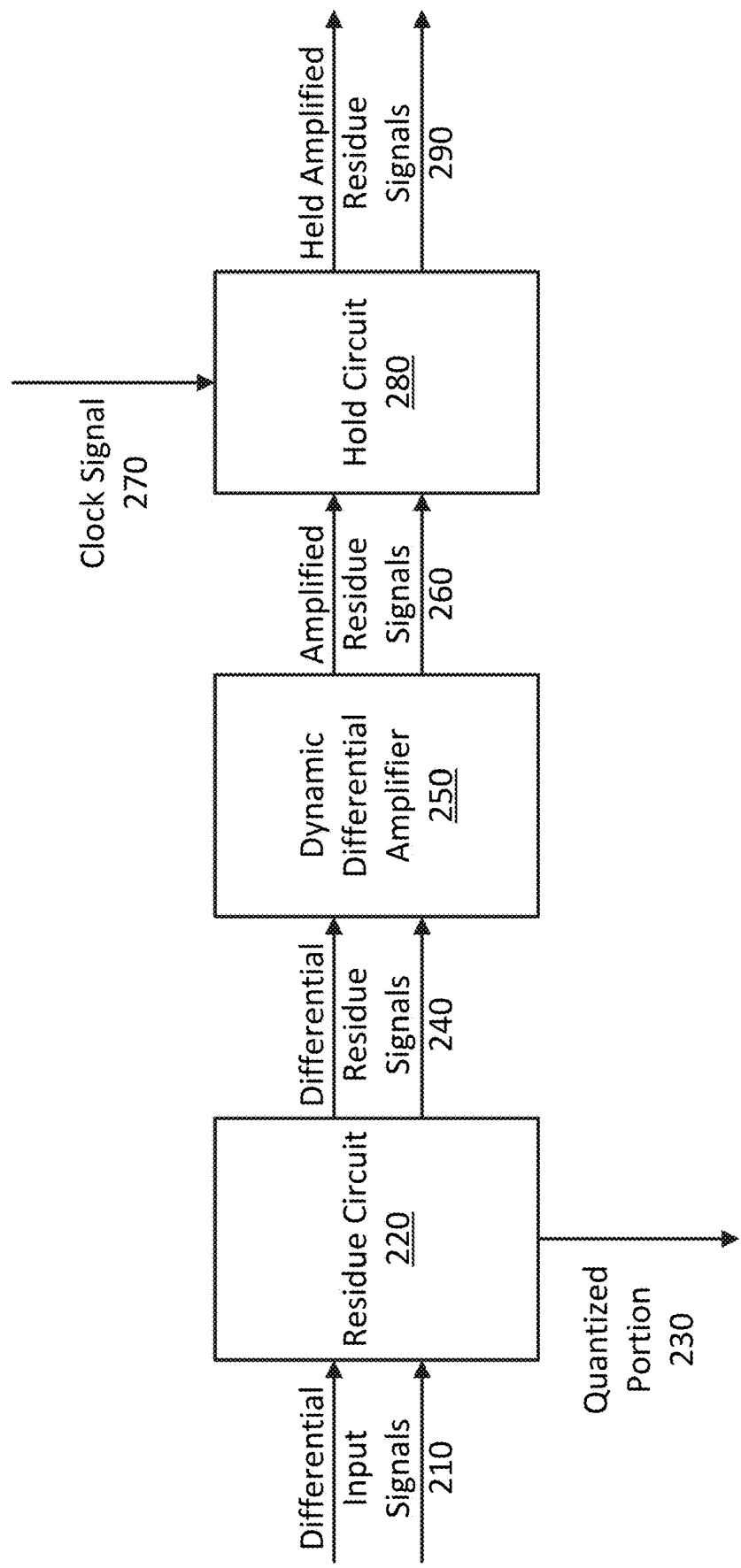
FIG. 2 is a block diagram of an example dynamic residue amplifier, such as for use with the pipelined ADC of FIG. 1, according to an embodiment of the present disclosure.

FIG. 2 is a block diagram of an example dynamic residue amplifier 200, such as for use with the pipelined ADC 100 of FIG. 1, according to an embodiment of the present disclosure. The dynamic residue amplifier 200 and other electronic components or circuits described herein can be implemented as an integrated circuit in a semiconductor fabrication technology, such as complementary metal-oxide semiconductor (CMOS) or n-type MOS (NMOS), to name a few.

For example, the dynamic residue amplifier 200 and other circuits disclosed herein may be custom hardware circuits or computer circuits configured (e.g., through predefined or customized logic, to name a few) to carry out the tasks assigned to the circuit. While circuits are illustrated as being made up of other circuits by function, in other embodiments, two or more circuits may be combined into a single circuit performing the functionality of the two or more circuits. In still other embodiments, a single circuit can be divided into two or more circuits, each performing separate functions performed by the single circuit. As will be further appreciated, a circuit as used herein is a physical structure capable of carrying out one or more functionalities as variously provided herein. For example, the structure can be hardware such as purpose-built semiconductor (e.g., gate-level logic or application specific integrated circuit) or a printed circuit board populated with discrete components configured and arranged to carry out the various functionalities provided herein. Numerous such embodiments and configurations will be appreciated in light of this disclosure.

Referring to FIG. 2, the dynamic residue amplifier 200 includes a residue circuit 220 that receives differential input signals 210 (such as the differential input signals 110 of the pipelined ADC 100, or amplified residue signals output from an earlier stage of the pipelined ADC 100). The residue circuit 220 operates on the differential input signals 210 (e.g., performs a division operation) to generate a quantized portion 230 and differential residue signals 240 with respect to a gain amount of the dynamic residue amplifier 200. By way of example, the gain amount of the dynamic residue amplifier 200 can be 8, and the differential input signals can span a voltage range between 0 and R. The residue circuit 220 can divide the range into eight portions, such as 0 to R/8, R/8 to 2R/8, 2R/8 to 3R/8, and so on up to 7R/8 to R, assigning a different quantized value (such as 0, 1, 2, . . . , 7) to each portion, assign the differential input signals 210 to the appropriate portion (e.g., through comparison logic), output the corresponding quantized value, and subtract the voltage level of the start of the portion from the differential input signals 210 to arrive at the differential residue signals 240.

The differential residue signals 240 have a small value, such as between 0 and R/8. Accordingly, the dynamic residue amplifier 200 further includes a dynamic differential amplifier 250 to amplify the differential residue signals 240 into (differential) amplified residue signals 260. By continuation of the above example, if the dynamic differential amplifier 250 has a gain amount of 8, the differential residue signals 240 can be multiplied by 8 to produce the amplified residue signals 260. The amplified residue signals 260 take on values, for example, between 0 and R. The amplified residue signals 260 are input to a hold circuit 280. The hold circuit 280 holds the amplified residue signals 290 in response to a clock signal 270 (e.g., the amplified residue signals 290 are held for one clock cycle). The held amplified residue signals 290 can, for example, be processed by s subsequent circuit (such as a subsequent dynamic residue amplifier in a pipelined ADC) during the next clock cycle.

Figure 3:
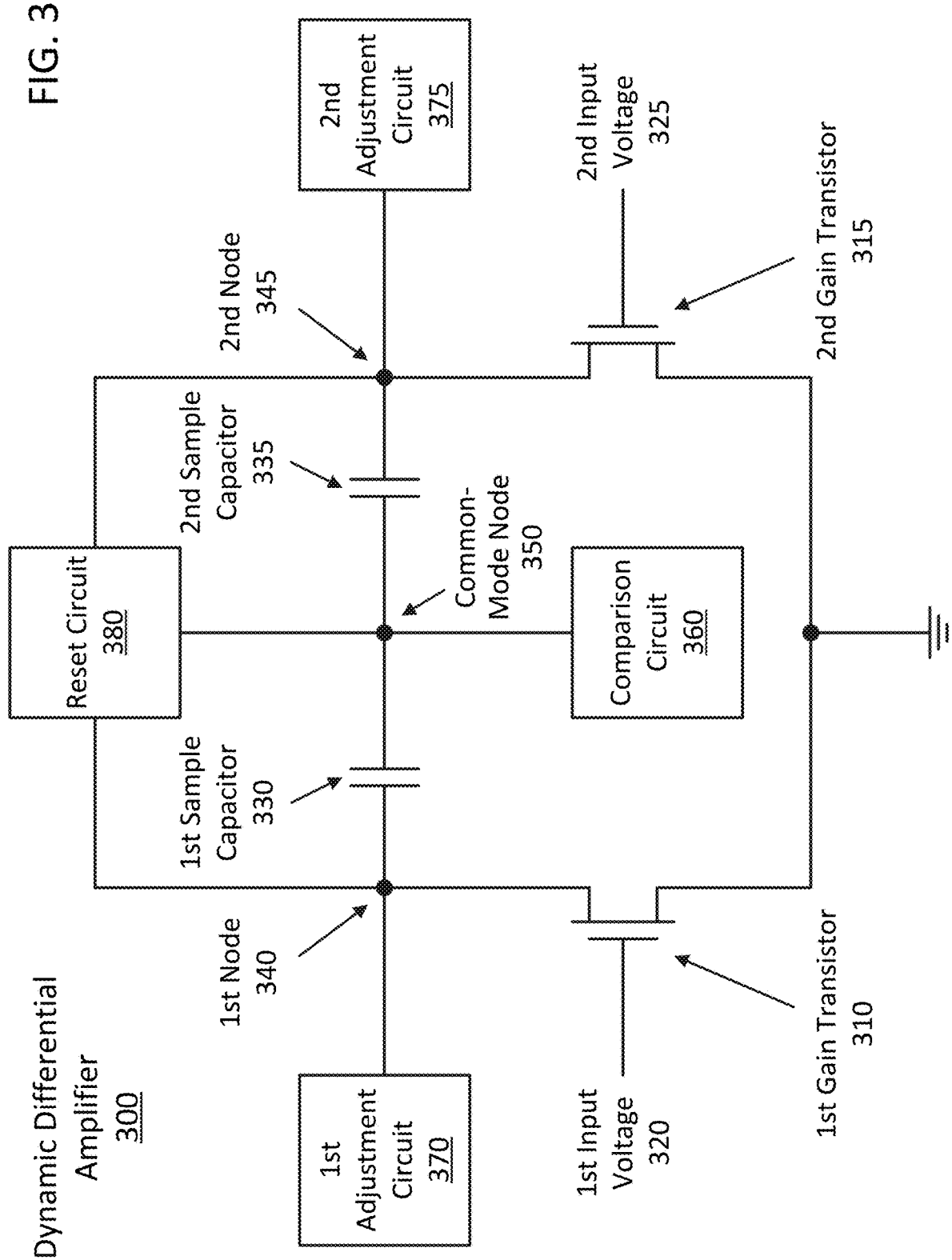
FIG. 3 is a schematic diagram of an example dynamic differential amplifier, such as for use with the dynamic residue amplifier of FIG. 2, according to an embodiment of the present disclosure.

FIG. 3 is a schematic diagram of an example dynamic differential amplifier 300, such as for use with the dynamic residue amplifier 200 of FIG. 2, according to an embodiment of the present disclosure. Referring to FIG. 3, the dynamic differential amplifier 300 includes a differential pair of gain transistors, namely a first gain transistor 310 and a second gain transistor 315. The first gain transistor 310 and the second gain transistor 315 are illustrated as nFETs, but can be different types of transistors in other embodiments. The first gain transistor 310 and the second gain transistor 315 are driven by a corresponding pair of differential input signals, namely first input voltage 320 and second input voltage 325. The first input voltage 320 and the second input voltage 325 can be centered about a target voltage level, such as a voltage level well within the linear performance region for the first gain transistor 310 and the second gain transistor 315. As such, differences between the first input voltage 320 and the second input voltage 325 amplify linearly (e.g., consistently, such as by a consistent gain amount) in the dynamic differential amplifier 300.

The dynamic differential amplifier 300 further includes a first sample capacitor 330 and a second sample capacitor 335 for sampling the voltage of a first node 340 and a second node 345, respectively. For example, the first node 340 can represent the voltage of a first terminal of the first sample capacitor 330 while the second node 345 can represent the voltage of a first terminal of the second sample capacitor 335. The differential voltages of the first node 340 and the second node 345 correspond to the differential amplified voltages of the first input voltage 320 and the second input voltage 325. The voltages of the first node 340 and the second node 345 ramp (e.g., decrease) linearly with respect to the first input voltage 320 and the second input voltage 325, respectively, in response to the first gain transistor 310 and the second gain transistor 315. The voltages of the second terminals of the first sample capacitor 330 and the second sample capacitor 335 are shared with that of a common node, namely common-mode node 350. The common-mode node 350 maintains the common-mode voltage level midway between the ramping voltage levels of the first node 340 and the second node 345.

The dynamic differential amplifier 300 further includes a comparison circuit 360 (such as an inverter circuit) to compare the common-mode voltage level of the first node 340 and the second node 345 to a threshold voltage level. This can provide an indication to the dynamic differential amplifier 300 to stop ramping the first node 340 and the second node 345 (or, to be more precise, stop ramping the voltage levels of the first node 340 and the second node 345), such as when the stored charges at the first node 340 and the second node 345 are mostly drained.

The dynamic differential amplifier 300 further includes a first adjustment circuit 370 and a second adjustment circuit 375 for adjusting (e.g., level shifting) the voltages of the first node 340 and the second node 345 at the completion of, and in the opposite direction of, the ramping. For example, to increase or maximize the amplification or gain of the dynamic differential amplifier 300, the ramping of the first node 340 and the second node 345 should take place over as much of the available voltage range as possible. However, this is likely to leave the common-mode voltage at a level significantly far away from the desired common-mode voltage (e.g., target voltage level for differential input signals of a subsequent circuit). For example, the first adjustment circuit 370 and the second adjustment circuit 375 adjust the differential amplified voltage levels (e.g., those of the first node 340 and the second node 345) by an offset voltage level to bring their common-mode voltage back to a desired target voltage level. By way of example, the offset voltage level can be the difference of the threshold voltage level and the target voltage level.

The dynamic differential amplifier 300 further includes a reset circuit 380 to reset the voltage levels of the first node 340 and the second node 345. For example, in operation, the reset circuit 380 can initialize the voltage level of the first node 340, the second node 345, and the common-mode node 350 to the highest voltage available (e.g., 0.9 volts or 0.9 V). The first gain transistor 310 and the second gain transistor 315 can ramp these reset voltage levels down to close to the lowest available voltage (such as a ground voltage or 0 V, or to a common-mode threshold voltage of about 0.3 V) in response to the first input voltage 320 driving the first gain transistor 310 and the second input voltage 325 driving the second gain transistor 315. The ramped voltage levels of the first node 340 and the second node 345 (representing the differential amplified voltage levels of the first input voltage 320 and the second input voltage 325) can then be adjusted to a target voltage level (such as 0.6 V) by increasing the voltage of each of the first node 340 and the second node 345 by 0.3 V.

Figure 4:
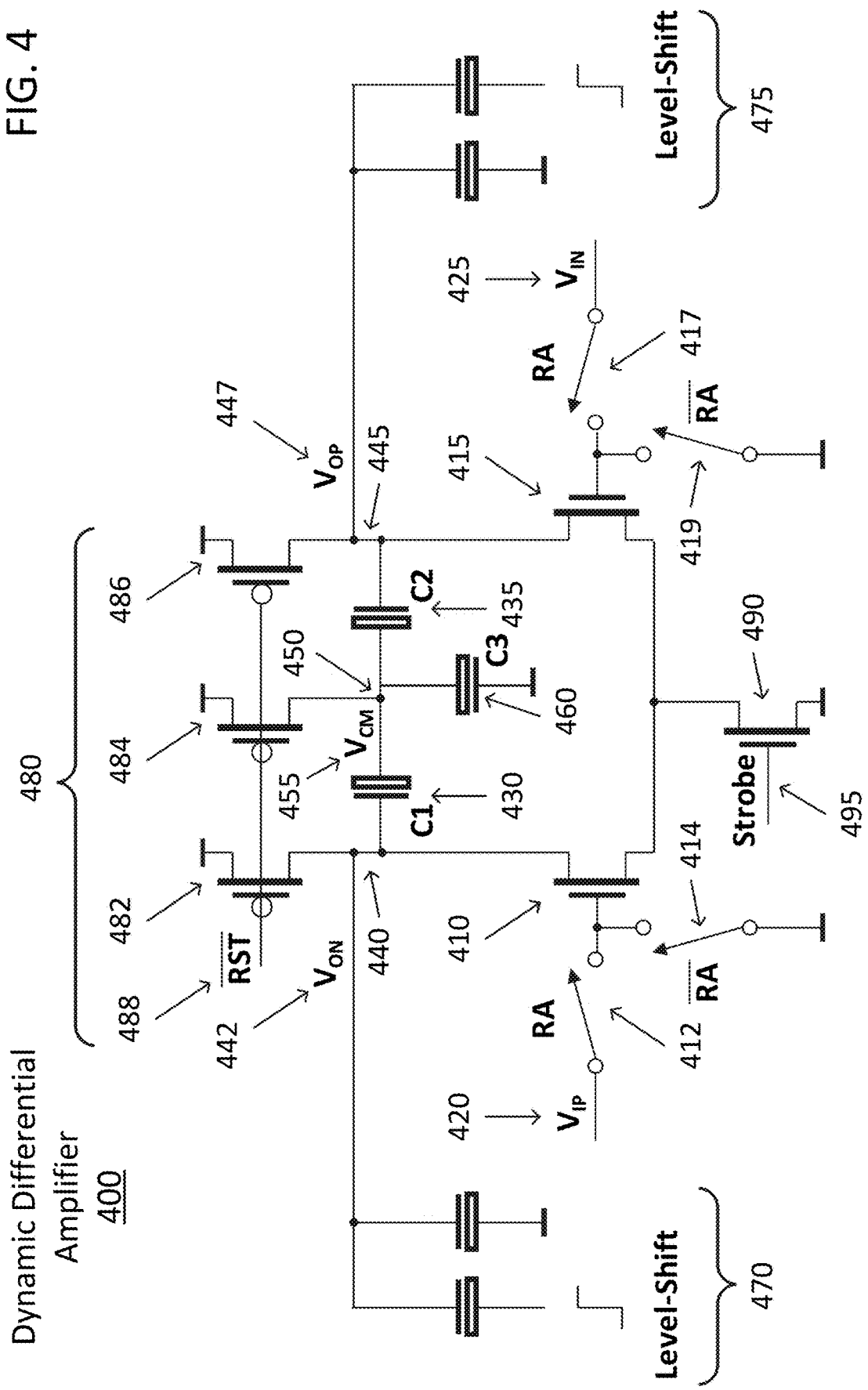
FIG. 4 is a circuit diagram of an example dynamic differential amplifier, such as the dynamic differential amplifier of FIG. 3, according to an embodiment of the present disclosure.

FIG. 4 is a circuit diagram of an example dynamic differential amplifier 400, such as the dynamic differential amplifier 300 of FIG. 3, according to an embodiment of the present disclosure. The dynamic differential amplifier 400 includes a differential pair of gain transistors, namely a first gain transistor 410 and a second gain transistor 415, for driving with differential input signals, namely first input voltage 420 (VIP) and second input voltage 425 (VIN), respectively. For example, in one embodiment, the first input voltage 420 is the higher of the two differential input signals while the second input voltage 425 is the lower of the two differential input signals. The first gain transistor 410 and the second gain transistor 415 are illustrated as nFETs, but can be different types of transistors in other embodiments.

In one or more embodiments, the first input voltage 420 and the second input voltage 425 are centered about a target voltage level for driving the first gain transistor 410 and the second gain transistor 415 (such as in the linear performance region of the gain devices, with sufficient room on either side to remain in the linear performance region of the gain devices). Accordingly, small differences in the first input voltage 420 and the second input voltage 425 manifest themselves as corresponding small linear differences in corresponding currents of the first gain transistor 410 and the second gain transistor 415, respectively. This allows small differences in the first input voltage 420 and the second input voltage 425 to be amplified by a consistent gain amount in the dynamic differential amplifier 400.

The dynamic differential amplifier 400 further includes a first input switch 412 and a second input switch 414 for controlling the input source to the first gain transistor 410. The first input switch 412 and the second input switch 414 are driven by complementary signals RA and $\overline{RA}$, respectively. When RA is active, the first input switch 412 directs the first input voltage 420 to drive the first gain transistor 410. When $\overline{RA}$ is active, the second input switch 414 directs low voltage (e.g., a ground voltage) to drive the first gain transistor 410 (e.g., turn off the first gain transistor 410). In a similar fashion, the dynamic differential amplifier 400 further includes a third input switch 417 and a fourth input switch 419 for controlling the input source to the second gain transistor 415. The third input switch 417 and the fourth input switch 419 are driven by the complementary signals RA and $\overline{RA}$, respectively. When RA is active, the third input switch 417 directs the second input voltage 425 to drive the second gain transistor 415. When $\overline{RA}$ is active, the fourth input switch 419 directs low voltage (e.g., a ground voltage) to drive the second gain transistor 415 (e.g., turn off the second gain transistor 415).

The dynamic differential amplifier 400 further includes a first sample capacitor 430 (C1) and a second sample capacitor 435 (C2) for sampling a first output voltage 442 (VON) of a first node 440 and a second output voltage 447 (VOP) of a second node 445, respectively. For example, the first output voltage 442 can represent the voltage of a first terminal of the first sample capacitor 430 while the second output voltage 447 can represent the voltage of a first terminal of the second sample capacitor 435. The differential voltages including the first output voltage 442 of the first node 440 and the second output voltage 447 of the second node 445 correspond to the differential amplified voltages of the first input voltage 420 and the second input voltage 425.

For example, in one embodiment, the second output voltage 447 is the higher of the two differential output signals while the first output voltage 442 is the lower of the two differential output signals. The first output voltage 442 of the first node 440 and the second output voltage 447 of the second node 445 ramp (e.g., decrease) linearly with respect to the first input voltage 420 and the second input voltage 425, respectively, in response to the first gain transistor 410 and the second gain transistor 415. Accordingly, in the embodiment of FIG. 4, the (higher) first input voltage 420 results in a (lower) first output voltage 442 (due to a higher drain current through the first gain transistor 410), while the (lower) second input voltage 425 results in a (higher) second output voltage 447 (due to a lower drain current through the second gain transistor 415). The voltages of the second terminals of the first sample capacitor 430 and the second sample capacitor 435 are shared with that of a common node, namely common-mode node 450. The common-mode node 450 maintains the common-mode voltage 455 (VCM) midway between the ramping voltage levels, namely the first output voltage 442 and the second output voltage 447, of the first node 440 and the second node 445, respectively.

The dynamic differential amplifier 400 further includes a division capacitor 460 (C3) to help with comparing the common-mode voltage 455 to a threshold voltage level. The crossing of the threshold voltage level by the common-mode voltage 455 can provide an indication to the dynamic differential amplifier 400 to stop ramping the first node 440 and the second node 445 (or, to be more precise, stop ramping the first output voltage 442 of the first node 440 and the second output voltage 447 of the second node 445), such as when the stored charges at the first node 440 and the second node 445 are mostly drained.

The dynamic differential amplifier 400 further includes a first level-shift circuit 470 and a second level-shift circuit 475 for adjusting (e.g., level shifting) the first output voltage 442 of the first node 440 and the second output voltage 447 of the second node 445 at the completion of, and in the opposite direction of, the ramping. For example, to increase or maximize the amplification or gain of the dynamic differential amplifier 400, the ramping of the first node 440 and the second node 445 should take place over as much of the available voltage range as possible. However, this is likely to leave the common-mode voltage 455 at a level significantly far away from the desired common-mode voltage (e.g., target voltage level for differential input signals of a subsequent circuit).

For example, the first level-shift circuit 470 and the second level-shift circuit 475 adjust the differential amplified voltage levels (e.g., the first output voltage 442 and the second output voltage 447) by an offset voltage level to bring their common-mode voltage 455 back to a desired target voltage level. By way of example, the offset voltage level can be the difference of the threshold voltage level and the target voltage level. By using a fixed offset voltage level, the difference between the amplified voltage levels is maintained (e.g., only the common-mode portion between them changes).

The dynamic differential amplifier 400 further includes a reset circuit 480 to reset the first output voltage 442, the second output voltage 447, and the common-mode voltage 455 in response to the signal RST (or, as illustrated, the resetting is under the control of p-node FET (pFET) 482, pFET 486, and pFET 484, respectively, and driven by the complementary signal $\overline{RST}$ 488). For example, in operation, the reset circuit 480 can initialize the first output voltage 442, the second output voltage 447, and the common-mode voltage 455 to the highest voltage available (e.g., 0.9 volts or 0.9 V). The first gain transistor 410 and the second gain transistor 415 can ramp these reset voltage levels down to close to the lowest available voltage (such as a ground voltage or 0 V, or to a common-mode threshold voltage of around 0.3 V) in response to the first input voltage 420 driving the first gain transistor 410 and the second input voltage 425 driving the second gain transistor 415. The ramped first output voltage 442 and second output voltage 447 (representing the differential amplified voltage levels of the first input voltage 420 and the second input voltage 425) can then be adjusted to a target voltage level (such as 0.6 V) by increasing the voltage of each of the first node 440 and the second node 445 by 0.3 V (e.g., difference between the target voltage level and the threshold voltage level).

The dynamic differential amplifier 400 further includes a ramp control circuit 490 to control the ramping of the first output voltage 442 and the second output voltage 447 by the first gain transistor 410 and the second gain transistor 415, respectively, in response to the signal Strobe 495. For example, the ramp control circuit 490 can connect the drains of the first gain transistor 410 and the second gain transistor 415 to a low voltage source (such as a ground voltage or other lowest available voltage).

In an example operation of the dynamic differential amplifier 400 according to an embodiment, there are four phases of the amplifying stage. The first phase is a reset phase, when the signal RST is asserted (or the complementary signal $\overline{RST}$ 488 is not asserted) and the first output voltage 442, the second output voltage 447, and the common-mode voltage 455 are reset (e.g., to a high voltage). The second phase is an input control phase, when the signal RA is asserted and the first input voltage 420 is connected to the first gain transistor 410 and the second input voltage 425 is connected to the second gain transistor 415. The third phase is a ramp control phase, when the signal Strobe 495 is asserted (and the signal RA is still asserted), and the first output voltage 442 and the and the second output voltage 447 (as well as the common-mode voltage 455) are ramped (e.g., by the driven first gain transistor 410 and second gain transistor 415) until their common-mode voltage reaches a threshold voltage. The fourth phase is an adjustment phase, when the ramped first output voltage 442 and second output voltage 447 are level shifted (in the opposite direction of the ramping) to an appropriate common-mode voltage level for driving a subsequent circuit to the dynamic differential amplifier 400.

While the above discussion has been mostly in relation to nFET or NMOS logic (e.g., a differential pair of nFETs to do the differential amplifying, ramping from a high voltage to a low voltage), other transistor types and corresponding ramping directions and voltage levels can be substituted for these as would be apparent in light of the present disclosure. By way of example, in some embodiments, the differential pair of transistors can be pFETs, with the differential output voltages ramping from low voltage (e.g., 0 V) up to voltages close to a high voltage.

FIGS. 5A-5B are timing diagrams of voltage gain in an example dynamic differential amplifier, such as the dynamic differential amplifier 400 of FIG. 4, according to an embodiment of the present disclosure. The differential input voltages have a difference of about 4 millivolts (mV) and are centered around a common-mode voltage of 600 mV (e.g., differential input voltages of about 602 mV and 598 mV). FIG. 5A illustrates the amplified difference 510 in the differential output voltages ramping over time (in nanoseconds (ns), from left to right), from 0 mV to 42 mV, for a gain amount of about 10. Meanwhile, in FIG. 5B, the differential output voltages (specifically, first output voltage 520 and second output voltage 530) are shown ramping down (in time (ns), from left to right) from initial voltages of 900 mV to final voltages of about 318 mV and 360 mV (e.g., the ramping stopping when the common-mode voltage crosses a threshold of around 340 mV). In the far right of FIG. 5B, the differential output voltages are adjusted upward to about 579 mV and 621 mV to level-shift their common-mode voltage to around 600 mV for a subsequent circuit to process.

Methodology

FIG. 6 is a flow diagram of an example method of differential amplifying, such as with the dynamic differential amplifiers 300 and 400 of FIGS. 3-4, according to an embodiment of the present disclosure. The method 600 (and other methods disclosed herein) may be performed, for example, by integrated circuits such as the dynamic differential amplifiers, dynamic residue amplifiers, and analog-to-digital converters (ADCs) disclosed herein. Throughout the description of the method 600, references may be made to corresponding components of the dynamic differential amplifiers, dynamic residue amplifiers, ADCs, and techniques of FIGS. 1-5B. In another embodiment, the method 600 may be implemented by a custom circuit such as a dynamic differential amplifier circuit with custom processing circuits configured to carry out the method 600. In other embodiments, the method 600 may be performed in conjunction with a special purpose processor, such as a signal processor. In addition, while the methods described herein may appear to have a certain order to their operations, other embodiments may not be so limited. Accordingly, the order of the operations can be varied between embodiments, as would be apparent in light of this disclosure. Numerous such embodiments and configurations will be appreciated in light of this disclosure.

Referring to the method 600 of FIG. 6, processing begins with driving 610 a differential pair of gain transistors (such as first gain transistor 310 and second gain transistor 315) with input voltage levels (such as first input voltage 320 and second input voltage 325), and ramping 620 first terminals (such as first node 340 and second node 345) of sample capacitors (such as first sample capacitor 330 and second sample capacitor 335) from an initial voltage level (such as high voltage) to differential amplified voltage levels (such as the low voltages of the first output voltage 520 and the second output voltage 530 shown in FIG. 5B) of the input voltage levels in response to the driven gain transistors. The method 600 further includes maintaining 630, at a common-mode node (such as common-mode node 450) shared by second terminals of the sample capacitors, a common-mode voltage level (such as common-mode voltage 455) midway between the ramping voltage levels of the first terminals (such as the first output voltage 442 and the second output voltage 447).

The method 600 further includes comparing 640 the maintained common-mode voltage level to a threshold voltage level (such as a lower voltage level, like a voltage level closer to the lowest voltage than to the mid-rail voltage or the target common-mode voltage of the differential input or differential output voltages, or a voltage level midway between the lowest voltage and a mid-rail or target common-mode voltage). Here, ramping the first terminals stops in response to the compared common-mode voltage level reaching the threshold voltage level. The method 600 further includes adjusting 650 the amplified voltage levels in the direction of the initial voltage level (such as upwards) by an offset voltage level (such as the difference between the target voltage level and the threshold voltage level). Numerous other methods and techniques will be apparent in light of the present disclosure.

Further Example Embodiments

The following examples pertain to further embodiments, from which numerous permutations and configurations will be apparent.

Example 1 is a dynamic differential amplifier including: gain transistors arranged in a differential amplifier configuration that is driven with differential input voltage levels and generates differential output voltage levels at first and second output nodes, the differential output voltage levels responsive to the differential input voltage levels; first and second sample capacitors each having a first terminal connected to a corresponding one of the first and second output nodes, and to ramp from initial output voltage levels to the differential output voltage levels; and first and second adjustment circuits to adjust the differential output voltage levels toward the initial voltage levels by an offset voltage level.

Example 2 includes the dynamic differential amplifier of Example 1, wherein second terminals of the sample capacitors share a common-mode node to maintain a common-mode voltage level midway between the ramping voltage levels of the first terminals.

Example 3 includes the dynamic differential amplifier of Example 2, further including a comparison circuit to compare the maintained common-mode voltage level to a threshold voltage level, wherein the first terminals of the sample capacitors stop ramping and the adjustment circuits adjust the differential output voltage levels in response to the compared common-mode voltage level reaching the threshold voltage level.

Example 4 includes the dynamic differential amplifier of Example 2, further including a division capacitor one of whose terminals also shares the common-mode node.

Example 5 includes the dynamic differential amplifier of Example 1, wherein the dynamic differential amplifier is part of a multi-stage circuit, and the adjusted differential output voltage levels are centered about a target voltage level for differential input signals of a subsequent stage of the multi-stage circuit.

Example 6 includes the dynamic differential amplifier of Example 1, further including a reset circuit to reset the first terminals of the sample capacitors to the initial voltage level.

Example 7 includes the dynamic differential amplifier of Example 1, further including a hold circuit to hold the adjusted differential output voltage levels for use by a subsequent circuit in response to a clock signal.

Example 8 is a dynamic residue amplifier including: the dynamic differential amplifier of Example 1; and a residue circuit to generate differential residue voltage levels from differential input signals with respect to a gain amount of the dynamic differential amplifier, to supply as the input voltage levels to the dynamic differential amplifier.

Example 9 is an analog-to-digital converter (ADC) including the dynamic residue amplifier of Example 8, wherein the residue circuit is a first residue circuit and is further to generate a first quantized portion from the differential input signals with respect to the gain amount of the dynamic differential amplifier, the differential residue voltage levels are first differential residue voltage levels, and the ADC further includes a second residue circuit to generate a second quantized portion and second differential residue voltage levels from the adjusted differential output voltage levels with respect to the gain amount of the dynamic differential amplifier.

Example 10 is a method of dynamic differential amplifying, the method including: driving a differential pair of gain transistors with input voltage levels; ramping first terminals of sample capacitors from an initial voltage level to differential amplified voltage levels of the input voltage levels in response to the driven gain transistors; and adjusting the amplified voltage levels in the direction of the initial voltage level by an offset voltage level.

Example 11 includes the method of Example 10, further including maintaining, at a common-mode node shared by second terminals of the sample capacitors, a common-mode voltage level midway between the ramping voltage levels of the first terminals.

Example 12 includes the method of Example 11, further including comparing the maintained common-mode voltage level to a threshold voltage level, wherein ramping the first terminals stops and adjusting the amplified voltage levels starts in response to the compared common-mode voltage level reaching the threshold voltage level.

Example 13 includes the method of Example 10, further including resetting the first terminals of the sample capacitors to the initial voltage level.

Example 14 includes the method of Example 10, further including holding the adjusted amplified voltage levels for use by a subsequent circuit in response to a clock signal.

Example 15 is a method of dynamic residue amplifying including: performing the dynamic differential amplifying using the method of Example 10; and generating differential residue voltage levels from differential input signals with respect to a gain amount of the dynamic differential amplifying, to supply as the input voltage levels to the dynamic differential amplifying.

Example 16 includes the method of Example 15, wherein the differential residue voltage levels are first differential residue voltage levels, the dynamic residue amplifying further including: generating a first quantized portion from the differential input signals with respect to the gain amount of the dynamic differential amplifying; and generating a second quantized portion and second differential residue voltage levels from the adjusted amplified voltage levels with respect to the gain amount of the dynamic differential amplifying.

Example 17 is a method of analog-to-digital converting including: performing the dynamic residue amplifying using the method of Example 16; and performing the dynamic differential amplifying a second time, this time supplying the second differential residue voltage levels as the input voltage levels to the second dynamic differential amplifying.

Example 18 is an analog-to-digital converter (ADC) including a plurality of dynamic residue amplifiers, at least one including: a dynamic differential amplifier including gain transistors to drive with differential input voltage levels, sample capacitors having first terminals to ramp from an initial voltage level to differential amplified voltage levels of the input voltage levels in response to the driven gain transistors, and adjustment circuits to adjust the amplified voltage levels in the direction of the initial voltage level by an offset voltage level; and a residue circuit to generate a quantized portion and differential residue voltage levels from differential input signals with respect to a gain amount of the dynamic differential amplifier, the residue voltage levels being supplied as the input voltage levels to the dynamic differential amplifier.

Example 19 includes the ADC of Example 18, wherein the at least one dynamic residue amplifier further includes a hold circuit to hold the adjusted amplified voltage levels as the differential input signals of the residue circuit of a subsequent one of the dynamic residue amplifiers in response to a clock signal, and the adjusted amplified voltage levels are centered about a target voltage level for the differential input signals of the residue circuit of the subsequent one of the dynamic residue amplifiers.

Example 20 includes the ADC of Example 18, wherein the differential input signals are the adjusted amplified voltage levels of the dynamic differential amplifier of a previous one of the dynamic residue amplifiers.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. In addition, various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications. It is intended that the scope of the present disclosure be limited not be this detailed description, but rather by the claims appended hereto. Future filed applications claiming priority to this application may claim the disclosed subject matter in a different manner, and may generally include any set of one or more elements as variously disclosed or otherwise demonstrated herein.

What is claimed is:

1. A dynamic differential amplifier comprising:
   gain transistors arranged in a differential amplifier configuration that is driven with differential input voltage levels and generates differential output voltage levels at first and second output nodes, the differential output voltage levels responsive to the differential input voltage levels;
   first and second sample capacitors each having a first terminal and a second terminal, wherein the first terminal is connected to a corresponding one of the first and second output nodes, and to ramp from initial output voltage levels to the differential output voltage levels, and wherein the second terminal of the first and second sample capacitors share a common-mode node to maintain a common-mode voltage level midway between the ramping voltage levels of the first terminals; and
   first and second adjustment circuits to adjust the differential output voltage levels toward the initial voltage levels by an offset voltage level.

2. The dynamic differential amplifier of claim 1 further comprising a comparison circuit to compare the maintained common-mode voltage level to a threshold voltage level, wherein the first terminals of the sample capacitors stop ramping and the adjustment circuits adjust the differential output voltage levels in response to the compared common-mode voltage level reaching the threshold voltage level.

3. The dynamic differential amplifier of claim 1 further comprising a division capacitor one of whose terminals also shares the common-mode node.

4. The dynamic differential amplifier of claim 1, wherein the dynamic differential amplifier is part of a multi-stage circuit, and
   the adjusted differential output voltage levels are centered about a target voltage level for differential input signals of a subsequent stage of the multi-stage circuit.

5. The dynamic differential amplifier of claim 1, further comprising a reset circuit to reset the first terminals of the sample capacitors to the initial voltage level.

6. The dynamic differential amplifier of claim 1, further comprising a hold circuit to hold the adjusted differential output voltage levels for use by a subsequent circuit in response to a clock signal.

7. A dynamic residue amplifier comprising:
   the dynamic differential amplifier of claim 1; and
   a residue circuit to generate differential residue voltage levels from differential input signals with respect to a gain amount of the dynamic differential amplifier, to supply as the input voltage levels to the dynamic differential amplifier.

8. An analog-to-digital converter (ADC) comprising the dynamic residue amplifier of claim 7, wherein
   the residue circuit is a first residue circuit and is further to generate a first quantized portion from the differential input signals with respect to the gain amount of the dynamic differential amplifier,
   the differential residue voltage levels are first differential residue voltage levels, and
   the ADC further comprises a second residue circuit to generate a second quantized portion and second differential residue voltage levels from the adjusted differential output voltage levels with respect to the gain amount of the dynamic differential amplifier.

9. A method of dynamic differential amplifying, the method comprising:
   driving a differential pair of gain transistors with input voltage levels;
   ramping first terminals of the sample capacitors from an initial voltage level to differential amplified voltage levels of the input voltage levels in response to the driven gain transistors;
   adjusting the amplified voltage levels in the direction of the initial voltage level by an offset voltage level; and
   maintaining, at a common-mode node shared by second terminals of the sample capacitors, a common-mode voltage level midway between the ramping voltage levels of the first terminals.

10. The method of claim 9, further comprising comparing the maintained common-mode voltage level to a threshold voltage level, wherein ramping the first terminals stops and adjusting the amplified voltage levels starts in response to the compared common-mode voltage level reaching the threshold voltage level.

11. The method of claim 9, further comprising resetting the first terminals of the sample capacitors to the initial voltage level.

12. The method of claim 9, further comprising holding the adjusted amplified voltage levels for use by a subsequent circuit in response to a clock signal.

13. A method of dynamic residue amplifying comprising:
   performing the dynamic differential amplifying using the method of claim 9; and
   generating differential residue voltage levels from differential input signals with respect to a gain amount of the dynamic differential amplifying, to supply as the input voltage levels to the differential pair of gain transistors.

14. The method of claim 13, wherein the differential residue voltage levels are first differential residue voltage levels, the dynamic residue amplifying further comprising:
   generating a first quantized portion from the differential input signals with respect to the gain amount of the dynamic differential amplifying; and
   generating a second quantized portion and second differential residue voltage levels from the adjusted amplified voltage levels with respect to the gain amount of the dynamic differential amplifying.

15. A method of analog-to-digital converting comprising:
performing the dynamic residue amplifying using the method of claim 14; and
performing the dynamic differential amplifying a second time, this time supplying the second differential residue voltage levels as the input voltage levels to the second dynamic differential amplifying.

16. An analog-to-digital converter (ADC) comprising a plurality of dynamic residue amplifiers, at least one of the dynamic residue amplifiers including:
a dynamic differential amplifier comprising
gain transistors to drive with differential input voltage levels,
sample capacitors having first terminals to ramp from an initial voltage level to differential amplified voltage levels of the input voltage levels in response to the driven gain transistors, and
adjustment circuits to adjust the amplified voltage levels in the direction of the initial voltage level by an offset voltage level; and
a residue circuit to generate a quantized portion and differential residue voltage levels from differential input signals with respect to a gain amount of the dynamic differential amplifier, the residue voltage levels being supplied as the input voltage levels to the dynamic differential amplifier.

17. The ADC of claim 16, wherein
the at least one dynamic residue amplifier further includes a hold circuit to hold the adjusted amplified voltage levels as the differential input signals of the residue circuit of a subsequent one of the dynamic residue amplifiers in response to a clock signal, and
the adjusted amplified voltage levels are centered about a target voltage level for the differential input signals of the residue circuit of the subsequent one of the dynamic residue amplifiers.

18. The ADC of claim 16, wherein the differential input signals are the adjusted amplified voltage levels of the dynamic differential amplifier of a previous one of the dynamic residue amplifiers.

* * * * *